United States Patent
Kleinhenz et al.

[11] Patent Number: 5,876,879
[45] Date of Patent: Mar. 2, 1999

[54] OXIDE LAYER PATTERNED BY VAPOR PHASE ETCHING

[75] Inventors: Richard L. Kleinhenz, Wappingers Falls; Wesley C. Natzle, New Paltz; Chienfan Yu, Highland Mills, all of N.Y.

[73] Assignee: International Business Machines Corporation, Armonk, N.Y.

[21] Appl. No.: 865,258

[22] Filed: May 29, 1997

[51] Int. Cl.$^6$ .................................................. G03F 9/00
[52] U.S. Cl. ............................................. 430/5; 430/311
[58] Field of Search .................... 430/5, 9, 311, 430/313; 216/43, 62

[56] References Cited

U.S. PATENT DOCUMENTS

| | | |
|---|---|---|
| Re. 31,506 | 1/1984 | Ogiue et al. . |
| 3,671,437 | 6/1972 | Pless . |
| 3,839,111 | 10/1974 | Ham et al. . |
| 3,860,464 | 1/1975 | Erdman et al. . |
| 3,976,524 | 8/1976 | Feng . |
| 3,994,817 | 11/1976 | Quintana . |
| 4,111,724 | 9/1978 | Ogiue et al. . |
| 4,343,677 | 8/1982 | Kinsbron et al. . |
| 4,517,106 | 5/1985 | Hopkins et al. . |
| 4,904,338 | 2/1990 | Kozicki . |
| 5,256,247 | 10/1993 | Watanabe et al. . |
| 5,268,069 | 12/1993 | Chapple-Sokol et al. . |
| 5,282,925 | 2/1994 | Jeng et al. . |
| 5,554,488 | 9/1996 | Rioux ....................................... 430/313 |
| 5,705,432 | 12/1995 | Lee et al. ................................. 430/314 |

OTHER PUBLICATIONS

T.K. Whidden et al.; Catalyzed HF Vapor Etching Of Silicon Dioxide For Micro–And Nanolithographic Masks; J. Electrochem. Soc., vol. 142, No. 4, Apr. 1995; pp 1199–1205.

*Primary Examiner*—S. Rosasco
*Attorney, Agent, or Firm*—Whitham, Curtis & Whitham; Alison D. Mortinger, Esq.

[57] ABSTRACT

Hydrogen fluoride undercut of oxide layers may be reduced by using a low pressure mixture of gaseous hydrogen fluoride and gaseous ammonia mixture. Organic photoresists can be used as a masking material when using the gaseous hydrogen fluoride/ammonia mixture without resulting in an enhanced reaction rate. In addition, because of the reaction conditions, the dimensions in the oxide layer being etched can be specifically sized smaller than openings made in the overcoating masking material.

10 Claims, 3 Drawing Sheets

OXIDE LAYER PATTERNED BY VAPOR PHASE ETCHING

CROSS-REFERENCE TO RELATED APPLICATIONS

This patent application is related to the two concurrently filed patent applications having Ser. Nos. 08/865,260, filed on May 29, 1997 and 08/865,261 filed on May 29, 1997, now U.S. Pat. No. 5,838,055, and bearing the titles of "VAPOR PHASE ETCHING OF OXIDE MASKED BY RESIST OR MASKING MATERIAL" and "TRENCH SIDEWALL PATTERNED BY VAPOR PHASE ETCHING", respectively, and the complete contents of these two concurrently filed applications is herein incorporated by reference.

BACKGROUND OF THE INVENTION

1. Field of the Invention

The present invention generally relates to computer chip manufacture, and more particularly to etch techniques used in constructing integrated circuit structures.

2. Background Description

In the early days of production of integrated circuits, patterned resist masks were used in concert with liquid, aqueous etches to remove the underlying regions that were not masked with resist. There was deterioration of the lithographically defined dimension caused by undercut of the resist masks by the isotropic character of the liquid etch. For this reason, more expensive reactive ion etching has largely supplanted the early method of liquid etching. However, vertical surfaces cannot easily be patterned with reactive ion etching.

Sometimes it is necessary to mask liquid phase etching of silicon dioxide or doped silicon dioxide. The most convenient way is to use resist to define the region to be etched. However, aqueous solutions of hydrogen fluoride can attack the interface between the resist and oxide leading to undercut of the resist with the best process conditions and leading to complete removal and failure of the resist mask under the worst conditions, where capillary action draws the aqueous solution completely under the resist. If the resist detaches, then all the wafers can be contaminated by resist particles. Etching with conventional, gaseous vapor hydrogen fluoride is also known to penetrate resist, and can even lead to enhanced etching under the resist. The aqueous films formed on the surface in this type of gaseous etching are also subject to capillary action at the resist/oxide interface.

Other well known problems associated with aqueous processing when hydrophobic resist or silicon surfaces are exposed is the deposition of particles that are suspended in solutions and the residue left by drying of droplets of solution. Both problems are associated with hydrophobic surfaces that cause solutions to "bead up" and particles to be attracted. Also, the surface tension of the liquid can prevent penetration and etching of small masked features.

It is possible in many applications to use a gaseous reactive ion etching process to remove unmasked material. This process does not have the resist adhesion, resist undercut, solution penetration, particle contamination from solution, and dried contaminant problems associated with aqueous processing. However, reactive ion etch (RIE) is expensive because only one wafer at a time is processed, the substrates are susceptible to unwanted damage, and tooling is complex. In addition, only horizontal surfaces which are parallel to the surface of the wafer can be patterned because the incident ions which are used to produce etching travel perpendicular to the wafer surface. Masked surfaces perpendicular to the wafer surface are not patterned. There are still applications where a vertical surface must be patterned, or where low cost is a requirement. A new method that does not degrade lithographic dimensions and which can process several wafers simultaneously with low cost would be advantageous.

A particularly important application of patterning of vertical oxide surfaces is in formation of a deep trench for use as in capacitor in Dynamic Random Access Memories. Particles or watermarks left behind on the hydrophobic sidewalls of the "aqueous processed" trench can cause failure of the trench. It is not possible to use Reactive Ion Etching to pattern the vertical trench surfaces.

Vapor phase hydrogen fluoride exposures have used photoresist masks to pattern silicon dioxide. However, conventional anhydrous vapor hydrogen fluoride, hydrogen fluoride/$H_2O$ and hydrogen fluoride/alcohol reactions act through an intermediary film of liquid. Thus, they are also susceptible to loss of resist adhesion and loss of pattern integrity through capillary action. In addition, the conventional processes take place with relatively high hydrogen fluoride partial pressures of tens of Torr or more. At these relatively high pressures, the hydrogen fluoride can even penetrate the resist layers and preferentially etch the oxide under the masked areas. See, for example, Whidden et al., *J. Electro Chem. Soc.* 142, 1199 (1995). Furthermore, both the aqueous HF and standard vapor HF process isotropically etch the unmasked region of oxide. It is not possible to etch an oxide layer to produce an exposed region of the underlayer with dimension smaller than the resist opening, or with a mouth opening less than the resist opening and two times the oxide layer thickness.

SUMMARY OF THE INVENTION

It is an object of the present invention to provide an improved hydrogen fluoride based oxide etch technique to be used with masking materials including organic photoresists.

It is another object to provide an improved method for forming a trench for use as in a capacitor in Dynamic Random Access Memories.

It is yet another object of this invention to provide a method for forming openings in an oxide layer on a substrate that are smaller than the openings in the overlying mask material.

According to the invention, a mask is positioned over an oxide layer to be etched. The mask has one or more openings defining the pattern to be etched into the oxide. This invention allows the openings in the mask to be larger in dimension than the openings to be formed in the oxide layer. In addition, if desired, this invention allows the mask to be created from an organic photoresist without enhancing the etch rate. After patterning the mask, the exposed oxide is reacted with gaseous hydrogen fluoride and ammonia. Finally, the mask and reaction products are removed.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

Figure 1:
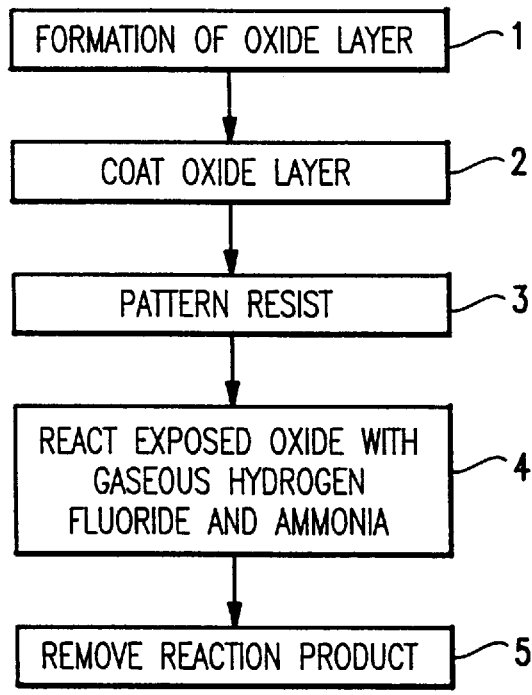
FIG. 1 is a flow chart depicting the inventive method.

Referring now to the drawings, and more particularly to FIG. 1, a flow diagram shows the steps of the invention. As can be seen in the step shown in block 1, an oxide layer is formed on a substrate. The oxide layer may be formed by thermal oxidation or deposition. Then, as shown in block 2, the oxide is coated with a mask material and, as shown in block 3, the mask is patterned. Patterning of mask may be accomplished by conventional methods including photolithography. The next step, as shown in block 4, is to react exposed oxide with hydrogen fluoride. To accomplish this, an individual substrate or a multiplicity of substrates with similar patterns are placed in a chamber, preferably at room temperature, and then exposed to a mixture of hydrogen fluoride and ammonia gas. The conditions in the chamber are preferably a total pressure of below 30 mTorr and relative flow rates of 2:1 for hydrogren fluoride:ammonia, respectively, for 40 minutes. The pressure is most preferably 7 mTorr.

A reaction product is formed as a result of the substrates' exposure to hydrogen fluoride and ammonia gas. This reaction product includes etched oxide and reactants and combinations thereof. Finally, as shown in block 5, the reaction product is removed. Preferably, removal is accomplished by heating the substrate to 100° C. to evaporate the reaction product as described in U.S. Pat. No. 5,282,925 to Jeng et al., which is herein incorporated by reference. Since neither the reaction product nor the reactants form liquids on the surface, capillary action is not possible. The reaction product may also be removed by rinsing.

Figure 2A:
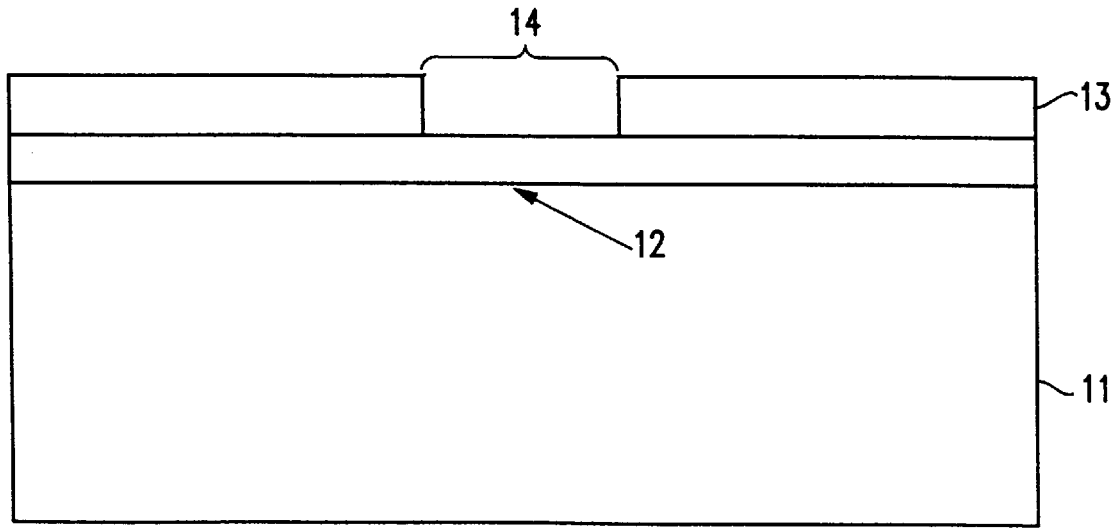
FIG. 2A is a cross sectional view of schematic of a substrate having an oxide layer and patterned mask.
Figure 2B:
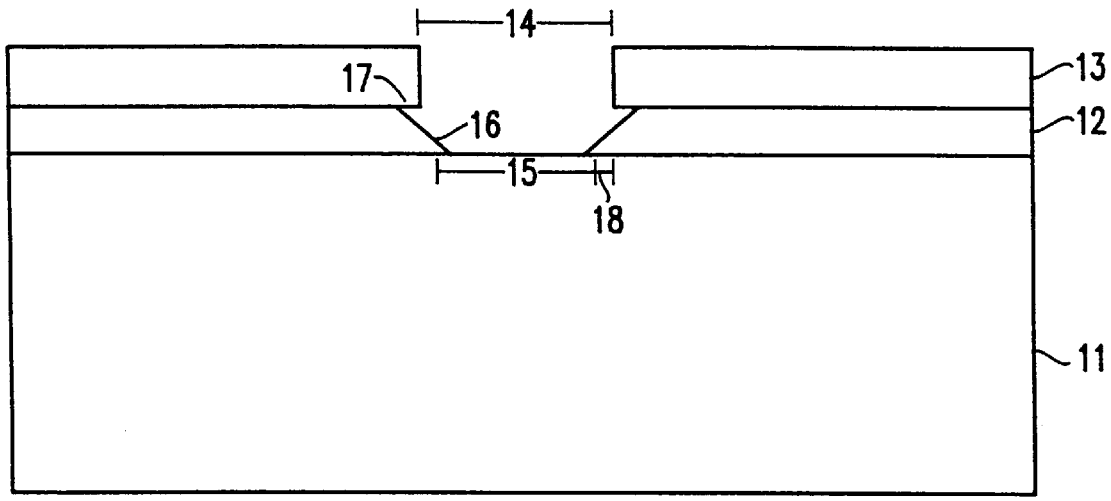
FIG. 2B is a cross sectional view of a schematic of the substrate shown in FIG. 2A after etching the oxide layer by the inventive method.

The steps of the invention are illustrated in the schematic cross sectional views shown in FIGS. 2A and 2B. In FIG. 2A, there is shown a substrate 11 having a silicon dioxide layer 12 deposited thereon. The silicon dioxide layer 12 may for example have a thickness between 10–600 Å. A patterned mask 13 is deposited on the silicon dioxide layer 12. As shown, the mask 13 has an opening 14 which exposes portions of the underlying silicon dioxide 12. While any masking material can be used for patterning the underlying silicon dioxide, it has been discovered that this invention can be practiced with organic photoresists (e.g., JSR 785 and AZ7500) which are available from a number of commercial vendors including the Shipley Company. This was unexpected because typical aqueous hydrogen fluoride (HF) etches lift the edges of photoresists, thus degrading the desired dimension. By contrast, with this invention, it is possible to improve upon the defined dimension.

Figure 2C:
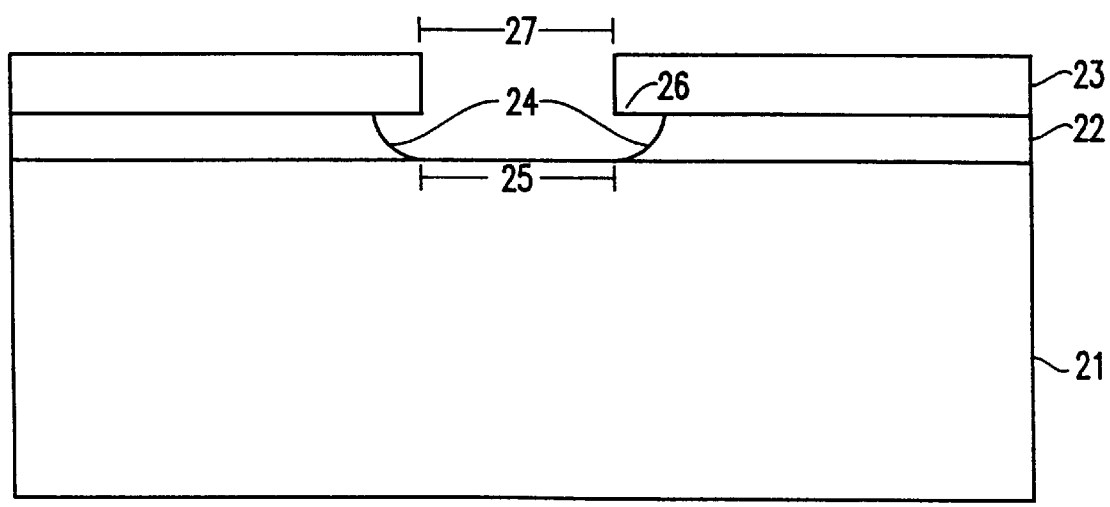
FIG. 2C is a cross sectional view of a schematic of the substrate shown in FIG. 2A after etching the oxide layer by the prior art method.

FIG. 2B shows the substrate after an opening 15 is etched in the silicon dioxide layer 12. Hydrogen fluoride does not penetrate the mask 13 because the operating pressure is about 7 mTorr. This pressure is more than three orders of magnitude lower than in standard vapor HF processes. Diffusion of HF through the mask is very slow and any water produced by the reaction escapes without forming a liquid on the surface. Loss of mask adhesion due to capillary action drawing the solution under the mask does not occur because the adsorbed film in the ammonia/hydrogen fluoride etching reaction more resembles solid ammonium bifluoride, rather than a conventional liquid that forms in vapor hydrogen fluoride processes or in aqueous etching. In fact, when the oxide thickness is near 150 Å, for instance, the dimension of the opening 15 is smaller than the opening 14 in the mask and is much smaller than the contour of the opening with an aqueous process 24 as is shown in FIG. 2C. The opening 15 has diagonally sloped sides 16 which narrow toward the surface of the substrate 11.

Returning the FIG. 2B, the undercut 17 with the inventive method is small because the reaction is not isotropic. The solid reaction product (not shown) occupies more volume than the etched oxide. It expands from the undercut and overlaps with reaction product from region 18. As the reaction product forms and expands, the reaction rate on the product covered surfaces declines. After about 600 Å of reaction product have formed (corresponding to 200 Å of reacted oxide), the reaction stops. The decline in reaction rate and termination occurs sooner in regions of reaction product overlap than where there is no overlap. Because of the overlap of product from undercut 17 under the overhang of the mask with product from above region 18, termination of the reaction leaves a contact area 15 that is smaller than the dimension of opening 14 in the mask 13 by the amount bracketed by region 18. B Preferably, the oxide layer 12 that is etched is somewhat less than 200 Å in thickness. Region 18 is smaller than ~400 Å and region 17 is smaller than 200 Å. At distances greater than 400 Å from the mask edge, there is no overlap of reaction product with reaction product from under the mask overhang 17.

Currently, the smallest opening that can be lithographically defined with conventional photolithography is about 1800 Å. Addition of this invention reduces the defined dimension by 400 Å on each side to produce a 1000 Å opening in the oxide. Thus, contact openings 15 of 1000 Å to 1800 Å in oxide layers can be defined by this process using conventional photolithography to pattern a photoresist layer used as mask 13. As photolithography processes improve, the contact opening should proceed to dimensions smaller than 1000 Å. For example, it is expected that using the procedure of this invention, one will be able to reliably pattern contact openings from 10 Å to 1800 Å.

In FIG. 2C there is shown a cross sectional view of substrate 21 similar to that shown in FIGS. 2A and 2B. The substrate 21 has oxide 22 and mask 23 positioned on its surface. As shown by illustration in FIG. 2C, the oxide 22 has been etched by aqueous hydrogen fluoride. Etching with aqueous hydrogen fluoride leaves an overhang 26 equal to the thickness of the oxide layer 22 as shown by contour 24. This is because the reaction occurs at the same rate on all exposed surfaces (i.e., it is isotropic). Reaction termination does not occur for this reaction as it does in the present invention. If there is loss of mask adhesion when etching with aqueous hydrogen fluoride, then the overhang 26 would be even greater. Thus, unlike the present invention, the cleared region 25 cannot be smaller than the opening 27 in the mask 23, and can be much larger.

The reduced attack of the mask/oxide interface of the present invention stems from several features of the gaseous ammonia/hydrogen fluoride reaction. The principle feature is that no liquid is involved. As mentioned previously, aqueous hydrogen fluoride can be drawn along the mask/oxide interface by capillary action. Even commercially available gaseous hydrogen fluoride and hydrogen fluoride/water or hydrogen fluoride/alcohol reactions can be subject to capillary effects. In these reactions the alcohol or the water that is added or that is available from the reaction products is used at a pressure that forms a thin adsorbed film of the liquid on the surface. The adsorbed film could be subject to capillary effects. The ammonia/hydrogen fluoride reaction also forms an adsorbed film, but the film is a solid ammonium bifluoride instead of a liquid. The solid is not mobile or subject to capillary action. A second feature is formation of a solid reaction product which occupies more volume than the volume of oxide etched and which blocks the interface from attack. A third feature is that the solid product inhibits diffusion of the reactant to the surface of the oxide. Away from an interface, reactant is able to diffuse to the surface from all directions. Thus, the reaction rate is higher away from a masked region than at the edge where reactant can only diffuse in from one direction. This effect contributes to enabling oxide openings to be smaller than the mask openings (it being expected that the oxide opening will be 2–800 Å smaller in dimension than the mask opening).

Figure 3:
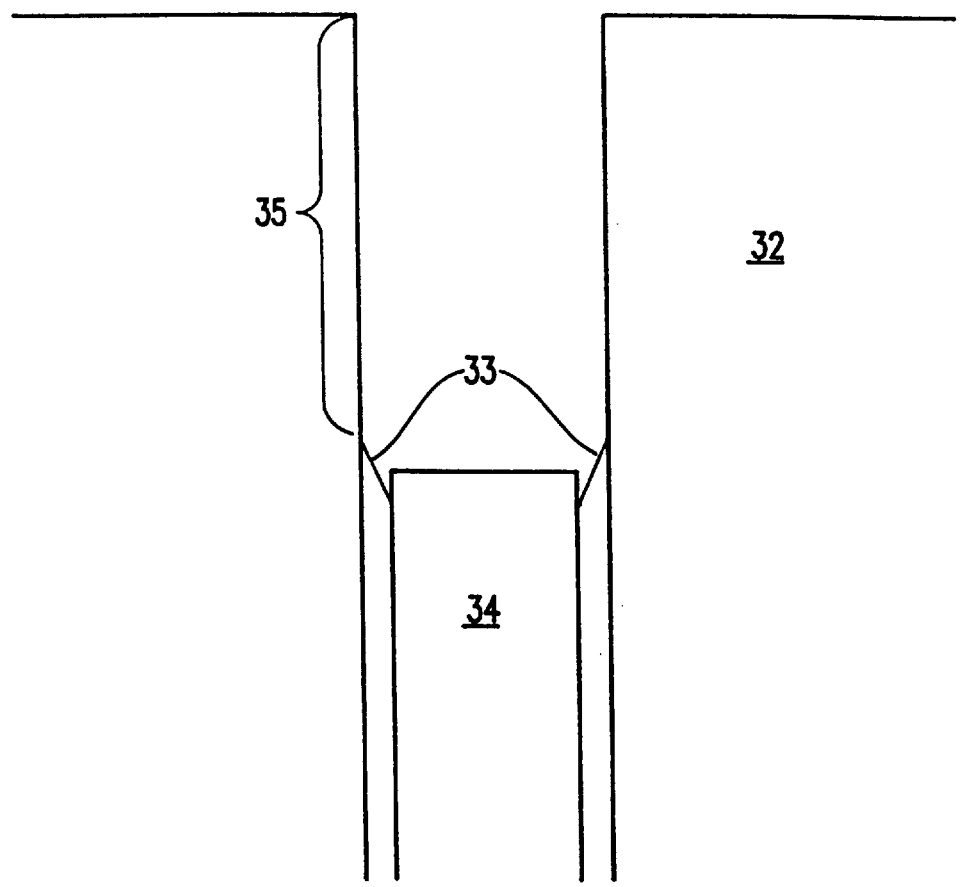
FIG. 3 is a schematic cross sectional view of the application of mask to mask vertical surfaces of deep trenches.

A particularly useful application of masking of silicon dioxide is in formation of the buried plate of the deep trench storage capacitor used in dynamic random access memories. A requirement of this application is the removal of oxide on a surface perpendicular to the substrate surface. This application is shown in FIG. 3. As can be seen in FIG. 3, a trench 31 is formed in a silicon substrate 32, the trench 31 is lined with arsenic doped glass 33 and filled with masking material 34. Other insulator materials such as silicon dioxide could be used as the liner 33, and other substrate materials besides silicon could be used. The masking material 34 is recessed in the trench 31 with respect to the top surface of the substrate by any suitable means including being deposited at a volume that makes it recessed in the substrate 32. The liner 32 is then stripped from the vertical sidewalls of the upper portion 35 of the trench 31 with gaseous hydrogen fluoride and ammonia at low pressure as described in detail above. After gaseous hydrogen flouride:ammonia etching, the remaining liner can then be used to dope the trench. It should be understood that a wide variety of other dopants can be used for this and other applications such as phosphorous, boron, indium, and antimony. Because this process patterns a vertical surface, RIE could not be used for this application (i.e., RIE works by directional bombardment, thus it can only be used to pattern features that are perpendicular to the direction of bombardment). Thus, in this application, the invention can include formation of a vertical surface in the substrate prior to the first step shown in block 1 of FIG. 1. The vertical surface can be part of the trench structure.

With this invention, the substrate can include hydrophobic features and, particularly, hydrophobic features of small dimension. The hydrophobic features can include silicon surfaces. The hydrophobic surface is only a problem when a liquid is in contact with the hydrophobic surface. The substrate can include features to be formed at a dimension smaller than the lithographically defined dimension. Etching oxide with a gaseous mixture of hydrogen fluoride and ammonia solves problems relating to masks, and is particularly useful for recessing arsenic glass when forming a deep trench. Less attack of the mask/oxide interface occurs when etching is with the gaseous process. In addition, since the process is gaseous, no watermarks or suspended particles are attracted to the hydrophobic surface of the silicon that remains after removal of the arsenic glass because a liquid is not used.

While the invention has been described in terms of its preferred embodiments, those skilled in the art will recognize that the invention can be practiced with modification within the spirit and scope of the appended claims.

We claim:

1. A patterned substrate for integrated circuits, comprising:

a substrate having a surface;

an oxide layer that is 200 Å or less in thickness positioned on said surface, said oxide layer having an opening therein which exposes a region on said surface, said opening having a dimension of less than 1800 Å wide;

a patterned mask layer positioned over said oxide layer having an opening over said opening in said oxide layer, said opening in said mask being larger than said opening in said oxide.

2. The patterned substrate of claim 1 wherein said opening has side walls which are diagonally sloped from said surface of said substrate to a surface of said oxide layer.

3. The patterned substrate of claim 1 wherein said opening has a dimension of 10 Å to 1000 Å.

4. A patterned substrate for integrated circuits, comprising:

a substrate having a first surface; and an oxide layer positioned on said first surface of said substrate, said oxide layer having a second surface in contact with said first surface of said substrate and a third surface spaced from said second surface by a thickness dimension of said oxide layer, said oxide layer having an opening which extends through said thickness dimension and exposes a region of said substrate at said first surface, said opening being formed by etching with hydrogen fluoride and ammonia under conditions where said opening has a first opening dimension at said third surface and a second opening dimension at said second surface wherein said first opening dimension is larger than said second opening dimension.

5. The patterned substrate of claim 4 wherein said opening has side walls which are diagonally sloped from said surface of said substrate to a surface of said oxide layer.

6. A patterned substrate for integrated circuits, comprising:

a substrate having a first surface;

an oxide layer positioned on said first surface of said substrate, said oxide layer having a second surface spaced from said first surfaces of said substrate by a thickness of said oxide layer, said oxide layer having an opening which extends through said thickness of said oxide layer to said first surface of said substrate, said opening in said oxide layer has a first width dimension at said surface of said substrate; and a mask positioned on said second surface, said mask having a second opening which is aligned with said first opening in said oxide layer, said opening in said oxide layer being formed through said second opening in said mask by etching with hydrogen fluoride and ammonia under conditions where said second opening in said mask has a second width dimension that is larger than said first width dimension in said oxide layer at said surface of said substrate.

7. The patterned substrate of claim 6 wherein said mask is an organic photoresist.

8. The patterned substrate of claim 6 wherein said thickness of said oxide layer is 200 Å or less.

9. The patterned substrate of claim 6 wherein said first width dimension is less than 1800 Å.

10. A patterned substrate for integrated circuits, comprising:

a substrate having a surface; and an oxide layer having a top surface and a bottom surface that is 200 Å or less in thickness, said bottom surface of said oxide layer being positioned on said surface of said substrate, said oxide layer having at least one opening which extends from said top surface to said bottom surface and exposes said surface of said substrate, said opening having a first dimension at said top surface and a second dimension at said bottom surface wherein said first dimension is larger than said second dimension.

* * * * *